United States Patent
Masini et al.

(10) Patent No.: US 10,175,113 B2
(45) Date of Patent: Jan. 8, 2019

(54) THERMAL PROTECTION MECHANISMS FOR UNCOOLED MICROBOLOMETERS

(71) Applicant: RAYTHEON COMPANY, Waltham, MA (US)

(72) Inventors: Paolo Masini, Santa Barbara, CA (US); John William Devitt, Goleta, CA (US)

(73) Assignee: RAYTHEON COMPANY, Waltham, MA (US)

( * ) Notice: Subject to any disclaimer, the term of this patent is extended or adjusted under 35 U.S.C. 154(b) by 94 days.

(21) Appl. No.: 15/485,942

(22) Filed: Apr. 12, 2017

(65) Prior Publication Data

US 2018/0299329 A1 Oct. 18, 2018

(51) Int. Cl.
| | |
|---|---|
| *G01J 5/20* | (2006.01) |
| *G01J 5/04* | (2006.01) |
| *G01J 5/22* | (2006.01) |
| *B81B 3/00* | (2006.01) |
| *G01J 5/02* | (2006.01) |
| *G01J 5/06* | (2006.01) |
| *H01L 31/0216* | (2014.01) |

(52) U.S. Cl.
CPC ............ *G01J 5/046* (2013.01); *B81B 3/0081* (2013.01); *G01J 5/0245* (2013.01); *G01J 5/045* (2013.01); *G01J 5/06* (2013.01); *G01J 5/20* (2013.01); *G01J 5/22* (2013.01); *H01L 31/02164* (2013.01); *B81B 2201/0207* (2013.01); *G01J 2005/065* (2013.01)

(58) Field of Classification Search
CPC ........ G01J 5/0853; G01J 5/0245; G01J 5/024; G01J 5/20; G02F 2201/083; H01L 2924/1461
See application file for complete search history.

(56) References Cited

U.S. PATENT DOCUMENTS

| | | | | |
|---|---|---|---|---|
| 5,550,373 | A * | 8/1996 | Cole | G01J 3/02 250/338.1 |
| 6,031,231 | A | 2/2000 | Kimata et al. | |
| 9,929,333 | B1 * | 3/2018 | Emadi | H01L 35/32 |
| 2003/0052271 | A1 * | 3/2003 | Fedder | G01J 5/02 250/338.4 |
| 2004/0147056 | A1 * | 7/2004 | McKinnell | B81B 7/0093 438/52 |
| 2004/0232337 | A1 * | 11/2004 | Vilain | G01J 5/02 250/338.1 |
| 2005/0133721 | A1 | 6/2005 | Kim et al. | |
| 2007/0138395 | A1 * | 6/2007 | Lane | G01J 1/04 250/353 |

(Continued)

OTHER PUBLICATIONS

International Search Report for application No. PCT/US2018/014650 dated Apr. 13, 2018.

*Primary Examiner* — Kiho Kim (74) *Attorney, Agent, or Firm* — Lando & Anastasi, LLP (57) ABSTRACT

Methods and apparatus for preventing solar damage, and other heat-related damage, to uncooled microbolometer pixels. In certain examples, at least some of the pixels of an uncooled microbolometer are configured with a bimetallic thermal shorting structure that protects the pixel(s) from excessive heat damage. In other examples a thermochroic membrane that becomes highly reflective at temperatures above a certain threshold is applied over the microbolometer pixels to prevent the pixels from being damaged by excessive heat.

14 Claims, 7 Drawing Sheets

(56) References Cited

U.S. PATENT DOCUMENTS

| | | | |
|---|---|---|---|
| 2009/0262778 A1 | 10/2009 | Ikushima | |
| 2010/0181485 A1* | 7/2010 | Legras | G01J 5/22 |
| | | | 250/338.3 |
| 2011/0266441 A1* | 11/2011 | Fagan, III | H01L 27/14625 |
| | | | 250/332 |
| 2011/0266443 A1* | 11/2011 | Schimert | G01J 1/02 |
| | | | 250/338.4 |
| 2013/0022077 A1* | 1/2013 | Harmon | G01J 5/20 |
| | | | 374/178 |
| 2013/0214158 A1* | 8/2013 | Kaufman | G01J 5/34 |
| | | | 250/338.1 |
| 2015/0137300 A1* | 5/2015 | Herrmann | G01J 5/20 |
| | | | 257/436 |
| 2016/0178444 A1* | 6/2016 | Oulachgar | G01J 5/20 |
| | | | 250/349 |

* cited by examiner

THERMAL PROTECTION MECHANISMS FOR UNCOOLED MICROBOLOMETERS

BACKGROUND

Uncooled microbolometer detectors are used in a wide variety of infrared or thermal imaging applications. Uncooled microbolometer pixels are vulnerable to changes in resistance and other damage when they are exposed to heat sources. Excessive heat fundamentally changes the response in the pixel and degrades the resulting image. Extreme heat sources, such as the Sun, can completely destroy the pixels. Conventional practice is to avoid direct exposure of an uncooled microbolometer detector to the Sun. If solar damage does occur, re-calibration of the detector may be necessary to obtain a usable image.

SUMMARY OF INVENTION

Aspects and embodiments are directed to methods and apparatus for preventing solar damage, or other heat-related damage, to uncooled microbolometer pixels.

According to certain embodiments, at least some of the pixels of a microbolometer are configured with a bimetallic thermal shorting structure that uses thermal properties of dissimilar metals to trigger a deformation of part of the pixel structure to protect the pixel from excessive heat damage.

According to further embodiments, a thermochroic membrane is applied directly to the microbolometer pixel structure. This thermochroic membrane becomes highly reflective at temperatures above a certain threshold, and thus acts to prevent the pixels from being damaged by excessive heat.

According to one embodiment an uncooled microbolometer includes a base substrate, a plurality of pixels arranged in an array on the base substrate, each pixel including a sensor layer supported above the base substrate by at least two first supports, and an infrared absorbing layer supported above and thermally isolated from the sensor layer by at least one second support, and at least one bimetallic switch coupled to a corresponding at least one pixel of the array of pixels, the bimetallic switch including a first layer of a first material and a second layer of a second material, and being configured to thermally short the corresponding at least one pixel to the base substrate in response to a temperature of the corresponding at least one pixel reaching a predetermined threshold.

In one example the uncooled microbolometer further includes a ground contact disposed on the base substrate, the at least one bimetallic switch being configured to thermally short the corresponding at least one pixel to ground via the ground contact. In another example, in a neutral state the at least one bimetallic switch is disposed parallel with the infrared absorbing layer of the corresponding at least one pixel, and in a shorting state the at least one bimetallic switch is deflected away from the infrared absorbing layer to thermally short the corresponding at least one pixel to the base substrate. In one example the at least one bimetallic switch is coupled to the infrared absorbing layer. In another example the at least one bimetallic switch is coupled to the second support. In one example the first material is titanium and the second material is aluminum. In another example the first material is titanium and the second material is silicon nitride. In another example the first material is aluminum and the second material is silicon nitride. In one example the at least one bimetallic switch includes a plurality of bimetallic switches, each bimetallic switch of the plurality of bimetallic switches being coupled to a corresponding one of the plurality of pixels. The uncooled microbolometer may further include a cap layer disposed over the plurality of pixels and coupled to the base substrate, the cap layer being configured to provide a cavity between an first surface of the base substrate and a second surface of the cap layer, and the plurality of pixels being disposed within the cavity.

According to another embodiment an uncooled microbolometer includes a base substrate, a plurality of pixels arranged in an array on the base substrate, a cap layer coupled to and disposed over the base substrate, the cap layer being configured to provide a cavity between the base substrate and the cap layer, the plurality of pixels being disposed within the cavity, and a thermally sensitive protective membrane disposed on the cap layer over a sub-array of at least some of the plurality of pixels, the thermally sensitive protective membrane including a thermochroic switch material configured to transition between a transmissive state and a reflective state in response to a temperature of thermochroic material reaching a predetermined threshold, the thermochroic material being transmissive to infrared radiation in the transmissive state and reflective to the infrared radiation in the reflective state.

In one example the thermochroic material is a vanadium oxide material. In one example the vanadium oxide material is $VO_2$. The uncooled microbolometer may further include a cover layer disposed over the thermally sensitive protective membrane. In one example the cap layer and the cover layer are each made of silicon nitride. In one example the sub-array of at least some of the plurality of pixels includes a 5×5 sub-array of pixels. In another example the sub-array of at least some of the plurality of pixels includes a 3×3 sub-array of pixels.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Figure 1:
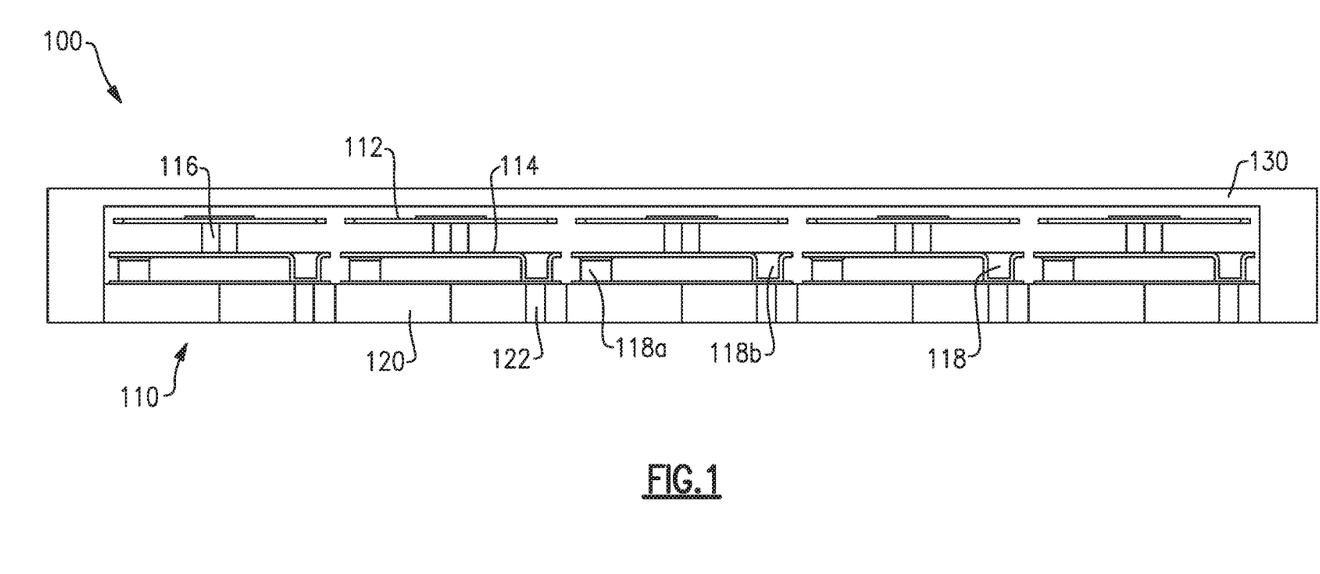
FIG. 1 is a cross-sectional schematic view of one example of a microbolometer according to aspects of the present invention.

A microbolometer is a type of uncooled thermal sensor. The microbolometer includes an array of pixels, each pixel being made up of several layers in what can be referred to as a "bridge" structure. For example, FIG. 1 is a cross-sectional view illustrating a portion of a microbolometer 100 including a plurality of pixels 110 according to certain embodiments. The microbolometer 100 includes a base substrate 120 on which the array of pixels 110 are formed. The base substrate 120 may be a silicon substrate, for example. Although not shown specifically in FIG. 1, the base substrate 120 may include a read-out integrated circuit (ROIC) for each pixel 110 or group of pixels. The ROIC processes signals received from each pixel 110 and provides output data that can be used to construct an image, as discussed further below. A cap layer 130, also referred to as a cap wafer, surrounds and encapsulates the array of pixels 110, forming a cavity between the cap layer 130 and the base substrate 120 in which the pixels 110 are disposed. The cavity is typically maintained under vacuum conditions to increase the longevity of the microbolometer 100. In certain examples the cap layer 130 is made of silicon nitride (SiN).

Each pixel 110 includes a layer of infrared (IR) absorbing material 112 and a sensor layer 114 that includes a thermal sensor or sensing circuitry. The IR absorbing layer 112 is suspended above and thermally isolated from the sensor layer 114 by supports 116. The sensor layer 114 is itself supported above the base substrate 120 by supports 118. Thus, as shown in FIG. 1, the pixels 110 have a so-called "bridge" structure. In certain examples, the IR absorbing layer 112 can be suspended approximately 2 microns (μm) above the sensor layer substrate 114. Because the microbolometer 100 does not undergo any cooling, the IR absorbing material 112 must be thermally isolated from the ROIC on the base substrate 120, and the bridge-like structure allows for this to occur.

In certain examples the supports 118 can provide electrical contacts for the pixels. Thus, in the illustrated example, each pixel 110 includes a pair of supports 118, including a first support 118a that can be connected to a reference potential, such as ground, and a second support 118b that can be connected to an electrical contact 122 on the base substrate 120 such that the sensing circuitry on the sensor layer 114 can be connected to the ROIC on the base substrate 120. In the example shown in FIG. 1, the electrical contact 122 includes a via extending through the base substrate 120. This can allow the ROIC associated with each pixel 110 (or group of pixels) to be connected to external circuitry (not shown), such that image data or other information can be transferred from the microbolometer 100 to external devices, such as image processors, memory, or other electronic devices.

Uncooled microbolometers produce images from thermal radiation through a known relationship between the resistance of each pixel 110 in the microbolometer 100 and the intensity of the received thermal radiation. In order to achieve satisfactory imaging resolution, the material used in the IR absorbing layer 112 should demonstrate large changes in resistance as a result of minute changes in temperature. The relationship between the change in resistance and the heat absorbed by the IR absorbing layer 112 is defined at least in part by the temperature coefficient of resistance (TCR) of the material. In certain examples, as the IR absorbing layer 112 is heated, due to incoming infrared radiation, the resistance of the material decreases. This is the case for materials with a negative temperature coefficient. Two materials that are commonly used as infrared detecting materials in microbolometers are amorphous silicon and vanadium oxide.

Recent studies have shown that when a microbolometer pixel is exposed to direct sunlight, the heat from solar energy causes the resistance of the microbolometer pixel to change in a way that causes permanent degradation in the performance (e.g., imaging resolution) of the pixel. Solar damage to microbolometers can be a particular problem for distributed aperture imaging systems because the Sun can often be in the field of view of such a system. Accordingly, it would be highly advantageous to provide microbolometers with mechanisms by which solar damage can be avoided or mitigated.

According to certain embodiments, a thermally sensitive bimetallic switch is integrated into the microbolometer pixel structure and configured to short, e.g. thermally short, the respective pixel to ground, for example, if the temperature of the pixel reaches a certain threshold. When any one or more pixels 110 of the microbolometer 100 are exposed to a potentially damaging heat source, such as the Sun or a powerful laser beam, for example, the IR absorbing layer 112 absorbs the heat, and the temperature of the pixel rises rapidly. According to certain embodiments, any or all pixels 110 of the microbolometer 100 can be provided with a thermally sensitive bimetallic switch configured to prevent the temperature of the pixel from rising above a certain threshold. The threshold can be selected such that the pixel is not permanently damaged at the threshold temperature. The materials of the bimetallic switch can be selected such that the switch is sensitive to temperature, and is activated at the threshold temperature to short the pixel to ground or to the base substrate, thereby providing a thermal "sink" and preventing the temperature of the pixel from rising significantly further and damaging the pixel.

Figure 2:
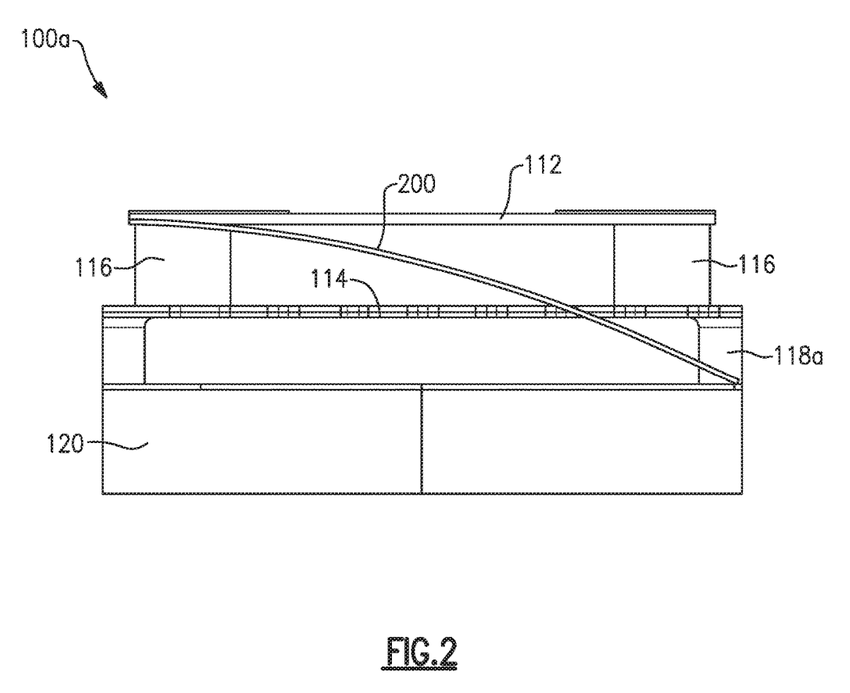
FIG. 2 is a cross-sectional view of a portion of a microbolometer incorporating a bimetallic switch, shown in the deflected position, according to aspects of the present invention.

Referring to FIG. 2 there is illustrated a pixel 110a incorporating an example of such a thermally sensitive bimetallic switch 200. The bimetallic switch 200 is attached to the IR absorbing layer 112 and/or the thermally isolating support 116. In the neutral state (i.e. at normal operating temperatures and below), the bimetallic switch 200 may lie parallel with the IR absorbing layer 112. The materials of bimetallic switch 200 can be selected such that the bimetallic switch 200 deflects or bends away from the IR absorbing layer 112 as the temperature of the pixel 110a rises. In certain examples the bimetallic switch 200 is configured such that when the temperature of the pixel 110a reaches a certain threshold, the bimetallic switch 200 is deflected sufficiently to contact the support 118a connected to ground, as shown in FIG. 2, thereby shorting the pixel 110a to ground. In other examples, a ground plane or ground contact can be provided on the base substrate 120, and the bimetallic switch 200 can be configured to contact that ground plane or contact (not necessarily the support 118a) when the temperature of the pixel 110a reaches the threshold. In other examples the bimetallic switch 200 can be configured to contact the base substrate 120 directly, thereby shorting the pixel 110a to the base substrate 120 and not necessarily to ground.

Figure 3A:
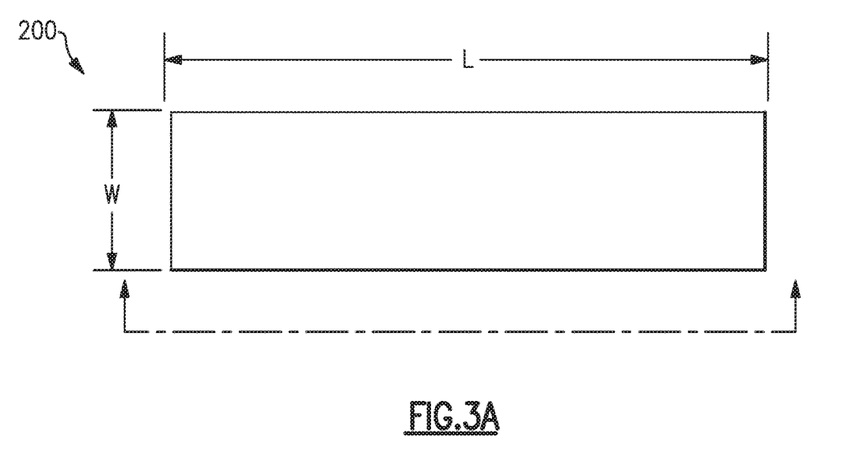
FIG. 3A is a plan view of one example of the bimetallic switch of FIG. 2, according to aspects of the present invention.
Figure 3B:
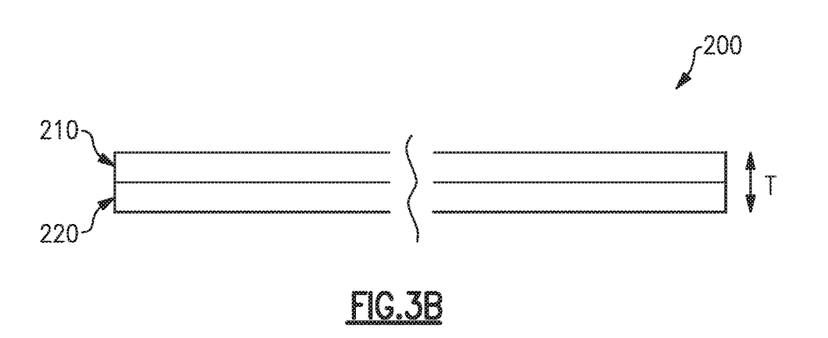
FIG. 3B is a cross-sectional view of the bimetallic switch of FIG. 3A taken along the dashed line shown in FIG. 3A.

The configuration of the bimetallic switch 200 may include its dimensions and materials. Referring to FIGS. 3A and 3B there is illustrated one example of the bimetallic switch 200. The bimetallic switch 200 includes a layer of a first material 210 and a layer of a second material 220. In one example the first material 210 is titanium (Ti) and the second material 220 is aluminum (Al). In another example the first material 210 is aluminum and the second material 220 is silicon nitride. In another example the first material 210 is titanium and the second material is silicon nitride. It certain embodiments, it can be advantageous to select titanium, aluminum, or silicon nitride as materials for the bimetallic switch 200 because these materials are commonly used in the manufacturing processes of the microbolometer 100. In addition, these materials allow the bimetallic switch 200 to deflect and short the pixel 110a to ground at threshold temperatures that are above the typical operating range for the microbolometer 100 (such that the presence of the bimetallic switch does not limit the imaging range or performance), but well below the levels at which significant or permanent damage to the pixel 110a occurs. However, those skilled in the art will appreciate, given the benefit of this disclosure, that embodiments of the bimetallic switch are not limited to using titanium, aluminum, or silicon nitride, and other materials may be selected.

The dimensions (length, width, thickness) of the bimetallic switch 200 may be selected based on the desired range of deflection to be achieved and the size of the pixel 110a. For example, the bimetallic switch 200 should have a thickness T and a width W both sufficiently thin such that an increase in temperature is able to cause deflection of the bimetallic switch 200 to achieve the shorting function discussed above. In addition, the thickness and the width should be sufficient such that the bimetallic switch 200 provides a good thermal shorting path. In certain examples the thickness of the bimetallic switch 200 is in a range of 0.004 μm to 0.175 μm. In certain examples the width of the bimetallic switch 200 is 3 μm. Further, the length L of the bimetallic switch 200 should be sufficient such that, in the fully deflected state as shown in FIG. 2, the bimetallic switch 200 contacts the grounding support 118a or grounding plane/contact on the base substrate 120. Thus, the length of the bimetallic switch 200 may depend at least in part on the size of the pixel 110a, in particular, the distance between the IR absorbing layer 112 and the base substrate 120 and the "pitch" or spacing between adjacent pixels. In certain examples in which the pixel pitch is 12 μm, the bimetallic switch has a length of 11 μm.

Figure 4:
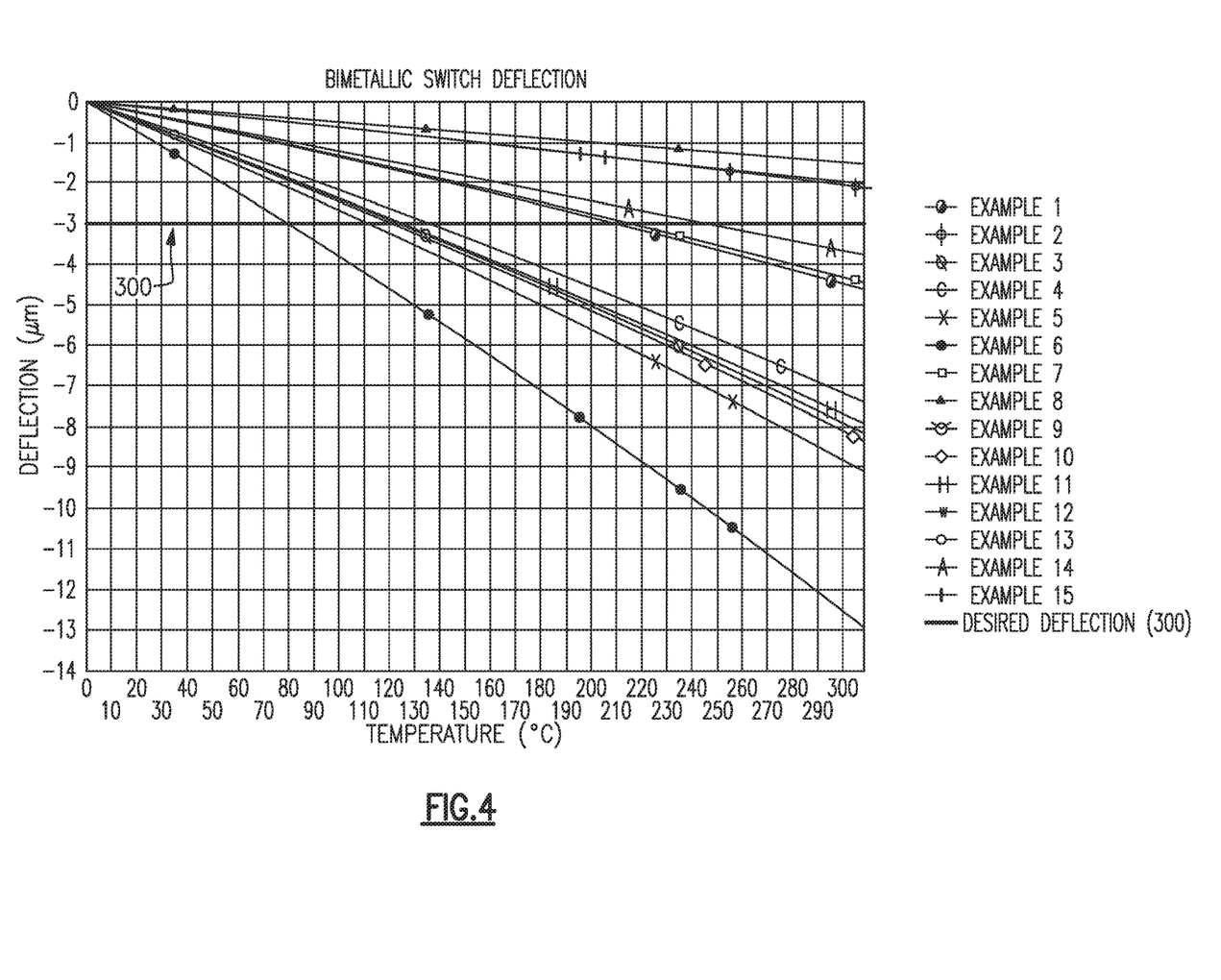
FIG. 4 is a graph showing deflection range (in micrometers) as a function of temperature for examples of a bimetallic switch corresponding to the structure and dimensions provided in FIGS. 3A and 3B and Table 1, according to aspects of the present invention.

FIG. 4 is a graph showing deflection (in μm) as a function of temperature for various examples of the bimetallic switch 200. In each example the bimetallic switch has a length of 11 μm and a width of 3 μm. For each example, the first and second materials 210, 220, are each one of titanium, aluminum, and silicon nitride, and the thickness of each material is provided in Table 1 below. Line 300 indicates a desired level of deflection. In the example of FIG. 4, the desired level of deflection is shown at 3 μm, corresponding to an example of a pixel 110a in which the IR absorbing layer 112 is positioned approximately 3 μm above the base substrate 120. However, in other examples the desired level of deflection may be different depending on, for example, different dimensions of the pixel 110a or different positioning of the bimetallic switch 200.

TABLE 1

| Example | Ti Thickness (μm) | Al Thickness (μm) | SiN Thickness (μm) |
|---|---|---|---|
| 1 | 0.035 | 0.07 | N/A |
| 2 | 0.035 | 0.14 | N/A |
| 3 | 0.018 | 0.04 | N/A |
| 4 | 0.035 | 0.035 | N/A |
| 5 | 0.02 | 0.035 | N/A |
| 6 | 0.02 | 0.02 | N/A |
| 7 | N/A | 0.07 | 0.035 |
| 8 | 0.02 | 0.035 | N/A |
| 9 | N/A | 0.035 | 0.02 |
| 10 | 0.02 | N/A | 0.02 |
| 11 | 0.035 | N/A | 0.02 |

The examples shown in FIG. 4 demonstrate that various configurations of the bimetallic switch 200 can deflect sufficiently within an appropriate temperature range to achieve the desired thermal shorting function.

Further aspects and embodiments are directed to the use of a thermally sensitive protective membrane that can be applied on the microbolometer pixel structure to prevent the microbolometer from being damaged when direct solar energy is in the field of view.

Figure 5:
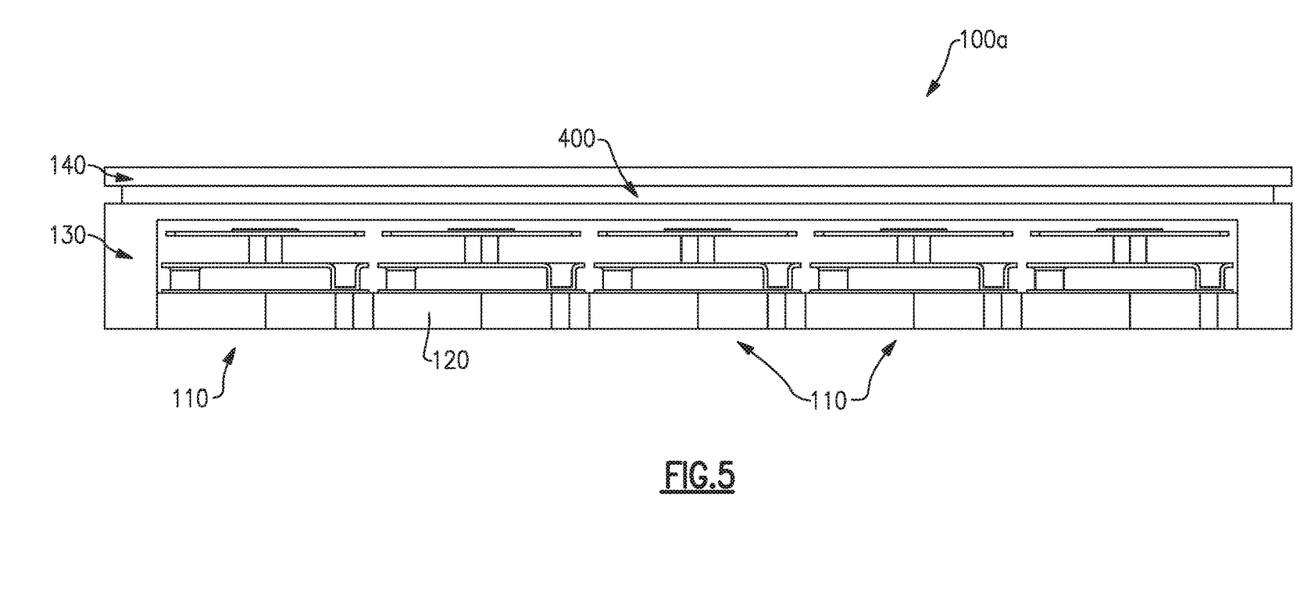
FIG. 5 is a cross-sectional view of a portion of a microbolometer incorporating a thermally sensitive protective membrane according to aspects of the present invention.
Figure 6:
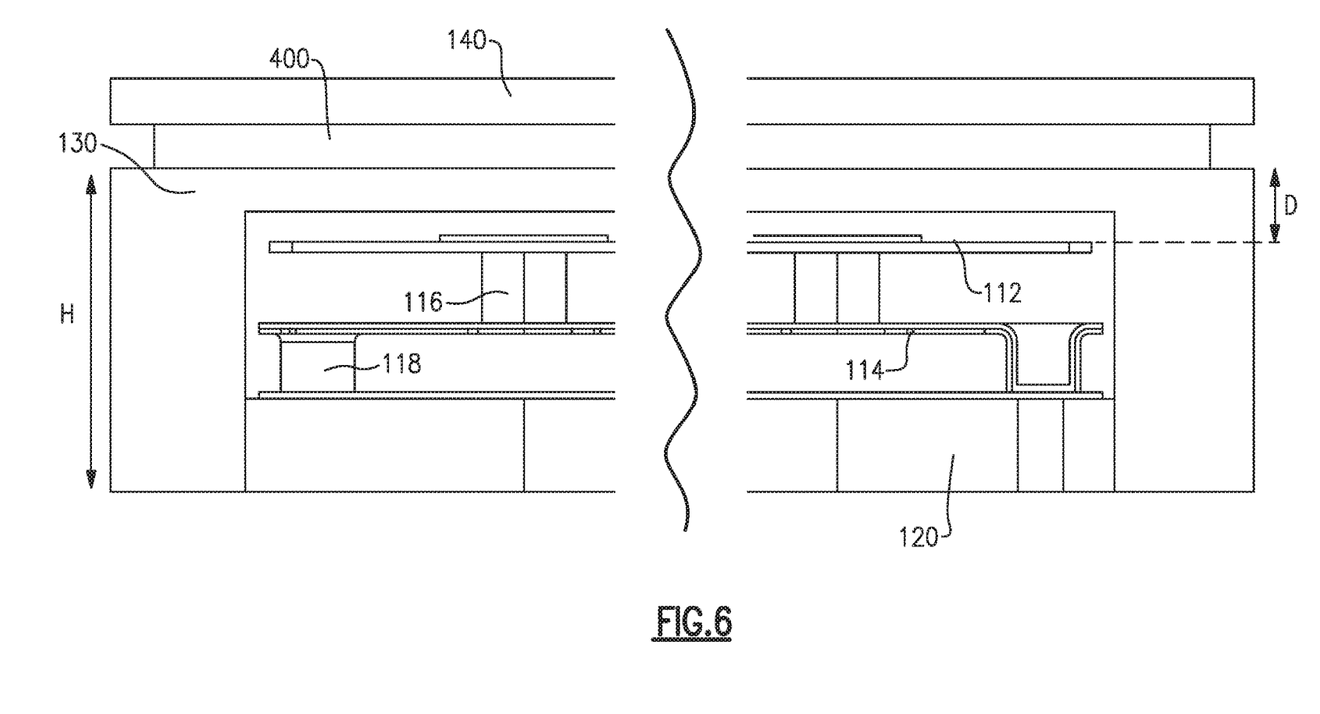
FIG. 6 is an enlarged view of a portion of the microbolometer of FIG. 5.

Referring to FIG. 5 there is illustrated a cross-sectional view of a portion of a microbolometer 100a including a protective membrane 400 integrated into the microbolometer structure. FIG. 6 shows an enlarged view of a portion of the microbolometer 100a of FIG. 5. As shown in FIG. 6, in one example the microbolometer 100a has a height H of approximately 6.975 μm, and the protective membrane 400 is applied over the cap layer 130 at a distance D above the IR absorbing layer 112. In this example, D is approximately 1.6 μm. The protective membrane 400 may include a thermochroic switch material, such as vanadium oxide, to act as a barrier to heat from the Sun or another intense heat source, such as a laser, for example, and prevent damage from exposure to such a heat source. Thermochroic switch materials, such as vanadium oxide, have material properties that cause the material to become highly reflective when elevated to temperatures above a certain threshold. These same materials are highly transmissive at temperatures below the threshold. For example, the $VO_2$ undergoes a metal-insulator phase change near approximately 67 degrees Celsius (° C.), and thus is highly transmissive to infrared radiation below this temperature threshold and highly reflective above it. Accordingly, by applying a coating or film of such a thermochroic material over the pixels 110 of the microbolometer 100a, as shown in FIGS. 5 and 6, excessive solar heat that would otherwise change the resistance value of the microbolometer pixels 110 and potentially damage the pixels 110 can be reflected away by the protective membrane 400 before any damage to the pixels 110 occurs, without compromising the imaging performance of the array. Other phases of vanadium oxide, and other thermochroic switch materials may undergo a phase change at different temperature thresholds. Thus, in certain examples the material of the protective membrane 400 can be chosen based on a suitable temperature threshold at which the material changes from being transmissive in a certain spectral range to reflective in that spectral range. In certain examples, a vanadium oxide material, such as $VO_2$, may be a desirable choice because other vanadium oxide materials are commonly used for other components in the microbolometer 100a and can be easily integrated into a CMOS fabrication process used to manufacture the microbolometer 100a.

According to certain embodiments, in the microbolometer 100a, the pixels 110 are arranged in rows and columns as a two-dimensional array. FIG. 5 illustrates an example of a row (or column) of five pixels 110. According to certain examples, the protective membrane 400 may be applied over all the pixels 110 of the microbolometer 100a as a continuous film. In other examples the protective membrane 400 can be applied as one or more discrete film "patches" over group(s) of pixels 110. For example, the protective membrane 400 can include one or more films provided over corresponding one or more sub-arrays of 3×3 pixels 110 or 5×5 pixels.

Still referring to FIGS. 5 and 6, in certain examples, a cover layer 140 can be applied over the protective membrane 400 to add structural support and protection for membrane 400. The cover layer 140 can be made from the same material as the cap layer 130. For example, the cover layer 140 may be made of silicon nitride.

Figure 7:
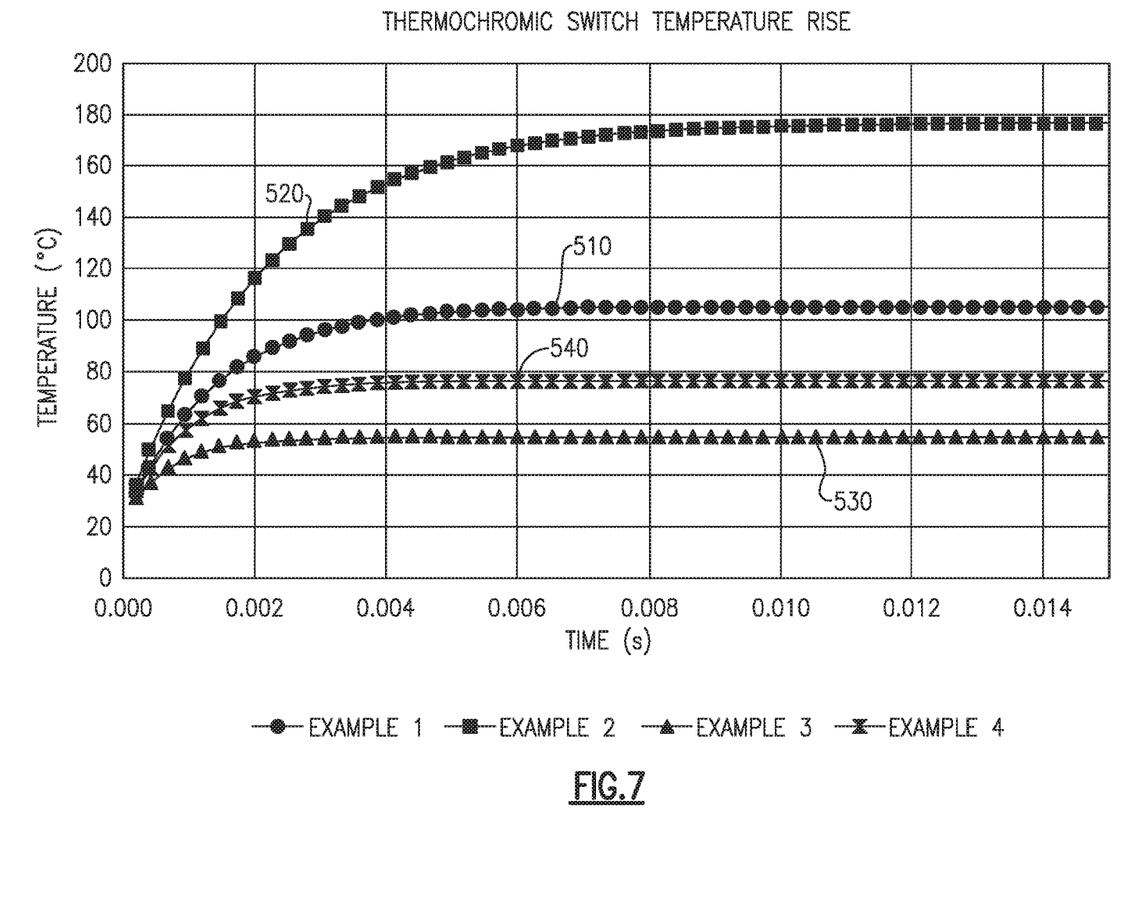
FIG. 7 is a graph showing rise in temperature over time of pixels in an example the microbolometer with different arrangements and materials of the protective membrane of FIGS. 5 and 6.

FIG. 7 is a graph showing the rise in temperature over time of the pixels 110 of an example of the microbolometer 100a for different arrangements and materials of the protective membrane 400. Tables 2 and 3 below provide parameters corresponding to the examples shown in FIG. 7. Table 2 applies to all four examples shown in FIG. 7 and described in Table 3.

TABLE 2

| Layer | Material | Conductivity (W/m-K) | Density (g/cc) | Specific Heat (J/g-K) |
|---|---|---|---|---|
| 130 | SiN | 1.24 | 1.38 | 0.9 |
| 400 | $VO_2$ | varied | 1.38 | 0.9 |

TABLE 3

| Example # | Pixel Arrangement | Membrane conductivity (W/m-K) | Steady-State Temperature (° C.) |
|---|---|---|---|
| 1 | 5 × 5 | 10 | 105.5 |
| 2 | 5 × 5 | 1 | 177.1 |
| 3 | 3 × 3 | 10 | 54.5 |
| 4 | 3 × 3 | 1 | 76.5 |

Referring to FIG. 7, as infrared radiation is received and absorbed by the pixels 110 of the microbolometer 100a, the temperature of the pixels 110 rises. However, due to the presence of the protective membrane 400, at a certain threshold, the pixels 110 reach a "steady state" temperature, above which the temperature of the pixels 110 does not appreciably rise further. As may be seen with reference to Table 3 and FIG. 7, the steady state temperature depends on various factors, including the arrangement of the pixels 110 over which the protective membrane 400 is applied and the thermal conductivity of the protective membrane 400.

In Example 1 (corresponding to curve 510), a protective membrane 400 of $VO_2$ was applied over a 5×5 array of pixels 110, and the protective membrane 400 was configured with a conductivity of 10 Watts per meter-Kelvin (W/m-k).

As infrared radiation is received by the pixels 110, the temperature of the pixels 110 rises over time, until reaching a threshold temperature at which the thermochroic switch material of the protective membrane 400 changes from being substantially transmissive to substantially reflective, and the protective membrane 400 starts to reflect the infrared radiation away from the pixels 110, preventing further significant increase in the temperature of the pixels 110. In Example 1, the pixels 110 reached a steady state temperature of approximately 105.5° C. after approximately 5 microseconds (μs).

In Example 2 (corresponding to curve 520), the protective membrane 400 of $VO_2$ was similarly applied over a 5×5 array of pixels 110, but was configured with a thermal conductivity of only 1 W/m-K. As shown in FIG. 7, in this example, the pixels 110 reached a steady state temperature of approximately 177° C. after approximately 9 μs.

In Examples 3 and 4, the protective membrane 400 of $VO_2$ was applied over a smaller 3×3 array of pixels 110. In Example 3 (corresponding to curve 530) the protective membrane 400 was configured with a thermal conductivity of 10 W/m-K (as in Example 1), and in Example 4 (corresponding to curve 540) with a thermal conductivity of 1 W/m-K (as in Example 2). As shown in FIG. 7, in Example 3 the pixels 110 reached a steady state temperature of approximately 54.5 degrees after approximately 2 μs, and in Example 4 the pixels 110 reached a steady state temperature of approximately 76.5 degrees after approximately 3 μs.

These examples show that a lower steady state temperature can be achieved by applying the protective membrane 400 over smaller sub-arrays of pixels 110 in the microbolometer 100a. Thus, the size of the pixel sub-arrays over which the protective membrane 400 is applied may be selected based at least in part on a desired range or approximate target value of the steady state temperature. It may be desirable that the steady state temperature is sufficiently high so as not to limit the thermal imaging range or performance of the microbolometer 100a, but sufficiently low such that the pixels 110 are not damaged by incident light. Further, the thermal conductivity of the thermochroic switch material used for the protective membrane 400 determines the uniformity of the temperature distribution of the protective membrane 400. A higher thermal conductivity of the protective membrane 400 results in a lower steady state temperature, other parameters being equivalent.

Thus, aspects and embodiments provide mechanisms by which solar damage, or damage from other intense heat/light sources, can be prevented in uncooled microbolometers. These mechanisms can be integrated into the pixel structure of the microbolometer to provide automatic protection without requiring additional devices external to the microbolometers. As discussed above, in certain examples a protective membrane made of a thermochroic switch material can be applied to the pixel bridge structure during manufacture of the microbolometer. The presence of the protective membrane allows the microbolometer to be inherently immune to damage from solar exposure through the action of the thermochroic switch material. In other examples, a bimetallic switch can be integrated into the pixel bridge structure to thermally short the pixels to the substrate, or other structure that can act as a thermal sink, in the presence of excessive heat. Thus, an increase in the scene or ambient temperature can be used to activate a mechanism to either deflect excessive energy away using the thermochroic membrane or thermally short the pixels using the bimetallic switch to mitigate excessive heat that could otherwise damage the pixels. The incorporation of such protective mechanisms may allow uncooled microbolometers to be used for applications where they have not been traditionally used due to vulnerability to solar damage, such as DAS systems for ground and airborne applications.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, it is to be appreciated that embodiments of the methods and apparatuses discussed herein are not limited in application to the details of construction and the arrangement of components set forth in the foregoing description or illustrated in the accompanying drawings. The techniques and mechanism disclosed herein are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation. Accordingly, the foregoing description and drawings are by way of example only, and the scope of the invention should be determined from proper construction of the appended claims, and their equivalents.

What is claimed is:

1. An uncooled microbolometer comprising:
   a base substrate;
   a plurality of pixels arranged in an array on the base substrate, each pixel including a sensor layer supported above the base substrate by at least two first supports, and an infrared absorbing layer supported above and thermally isolated from the sensor layer by at least one second support; and
   at least one bimetallic switch coupled to a corresponding at least one pixel of the array of pixels, the bimetallic switch including a first layer of a first material and a second layer of a second material, and being configured to thermally short the corresponding at least one pixel to the base substrate in response to a temperature of the corresponding at least one pixel reaching a predetermined threshold.

2. The uncooled microbolometer of claim 1 further comprising a ground contact disposed on the base substrate, the at least one bimetallic switch being configured to thermally short the corresponding at least one pixel to ground via the ground contact.

3. The uncooled microbolometer array of claim 2 wherein the ground contact is electrically connected to one of the at least two first supports of each pixel.

4. The uncooled microbolometer array of claim 2, wherein a first one of the at least two first supports is connected to the ground contact, and wherein in a neutral state the at least one bimetallic switch is disposed parallel with the infrared absorbing layer of the corresponding at least one pixel, and in a shorting state the at least one bimetallic switch is deflected away from the infrared absorbing layer to contact the first one of the at least two first supports.

5. The uncooled microbolometer of claim 1 wherein in a neutral state the at least one bimetallic switch is disposed parallel with the infrared absorbing layer of the corresponding at least one pixel, and in a shorting state the at least one bimetallic switch is deflected away from the infrared absorbing layer to thermally short the corresponding at least one pixel to the base substrate.

6. The uncooled microbolometer of claim 1 wherein the at least one bimetallic switch is coupled to the infrared absorbing layer.

7. The uncooled microbolometer of claim 1 wherein the at least one bimetallic switch is coupled to the second support.

8. The uncooled microbolometer of claim 1 wherein the first material is titanium and the second material is aluminum.

9. The uncooled microbolometer of claim 1 wherein the first material is titanium and the second material is silicon nitride.

10. The uncooled microbolometer of claim 1 wherein the first material is aluminum and the second material is silicon nitride.

11. The uncooled microbolometer of claim 1 wherein the at least one bimetallic switch includes a plurality of bimetallic switches, each bimetallic switch of the plurality of bimetallic switches being coupled to a corresponding one of the plurality of pixels.

12. The uncooled microbolometer of claim 1 further comprising a cap layer disposed over the plurality of pixels and coupled to the base substrate, the cap layer configured to provide a cavity between a first surface of the base substrate and a second surface of the cap layer, the plurality of pixels being disposed within the cavity.

13. The uncooled microbolometer array of claim 12 wherein the cap layer is made of silicon nitride.

14. The uncooled microbolometer array of claim 1 further comprising:
   a read-out integrated circuit formed in the base substrate and coupled to at least one of the at least two first supports of each pixel, the read-out integrated circuit being configured to receive and process signals from the plurality of pixels to provide output data for constructing an image.

* * * * *